(12) United States Patent
Jung

(10) Patent No.: US 7,592,271 B2
(45) Date of Patent: Sep. 22, 2009

(54) METHOD OF FABRICATING A FLASH MEMORY DEVICE

(75) Inventor: Woo Yung Jung, Seoul (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 12/147,222

(22) Filed: Jun. 26, 2008

(65) Prior Publication Data

US 2009/0124086 A1 May 14, 2009

(30) Foreign Application Priority Data

Nov. 13, 2007 (KR) .................... 10-2007-0115608

(51) Int. Cl.
*H01L 21/00* (2006.01)

(52) U.S. Cl. ............... 438/780; 438/257; 257/E21.176

(58) Field of Classification Search ......... 438/257–267, 438/780, 778
See application file for complete search history.

(56) References Cited

U.S. PATENT DOCUMENTS 5,639,688 A * 6/1997 Delgado et al. ............. 438/586

FOREIGN PATENT DOCUMENTS

KR 10-0574999 4/2006

OTHER PUBLICATIONS

Jung et al., "Double Patterning of Contact Array with Carbon Polymer," *Proc. Of SPIE*, 6924:69240C-2-69240C-10 (2008).
Korean Intellecutal Property Office Action (Korean-language) issued on Apr. 29, 2009, in connection with Korean priority application No. 2007-115608.

* cited by examiner

*Primary Examiner*—Richard A. Booth
(74) *Attorney, Agent, or Firm*—Marshall, Gerstein & Borun LLP

(57) ABSTRACT

A method of fabricating a flash memory device, in which a pre-metal dielectric layer, a hard mask layer, and a first etch mask pattern are sequentially formed over a semiconductor substrate; an auxiliary layer is formed along a surface of the first etch mask pattern and the hard mask layer; and an etch mask layer is formed on the auxiliary layer to gap-fill between adjacent first etch mask pattern elements. The etch mask layer is etched to form a second etch mask pattern between adjacent first etch mask pattern elements. The auxiliary layer between the first and second etch mask patterns is removed; and a hard mask pattern is formed by etching the hard mask layer between the first etch mask pattern and the second etch mask pattern. The pre-metal dielectric layer is etched process using the hard mask pattern as a mask to form contact holes.

11 Claims, 2 Drawing Sheets

METHOD OF FABRICATING A FLASH MEMORY DEVICE

CROSS-REFERENCE TO RELATED APPLICATION

Priority to Korean Patent Application No. 10-2007-0115608, filed on Nov. 13, 2007, the disclosure of which is incorporated herein by reference in its entirety, is claimed.

BACKGROUND OF THE INVENTION

1. Field of the Invention

The invention relates to a method of fabricating a flash memory device and, more particularly, to a method of fabricating a flash memory device, which can prevent lowering of reliability of the device during a process for forming drain contacts, while simplifying the process.

2. Brief Description of Related Technology

A flash memory device has the advantages of EPROM, having the programming and erase characteristics, and EEPROM, having the electrically programming and erase characteristics. The flash memory device achieves the storage state of one bit using one transistor and can be electrically programmed and erased.

Depending on the cell array structure, a flash memory device can be classified into a NOR type structure in which cells are arranged in parallel between bit lines and the ground and a NAND type structure in which cells are arranged in series between bit lines and the ground. Cell arrays of the NAND type flash memory device are connected by a string, unlike a general flash device. A drain contact connected to a bit line and a source line contact for a global ground are located at both ends of the string. The contacts are connected to junctions of a select transistor for string control.

A pattern process is generally performed to form the drain contact. For example, a plurality of hard mask layers are formed over a semiconductor substrate having an underlying structure that includes source contact plugs. A polysilicon layer is used as the hard mask layer. A bottom anti-reflective coating (BARC) layer is deposited on the polysilicon layer. Subsequent processes, including an exposure process and a development process, are then performed on a subsequently formed photoresist layer.

The stress of amorphous carbon formed below the polysilicon layer causes cracks to generate during deposition of the polysilicon layer, which may lower reliability of the device. As a result, process steps are added such as etching of the BARC layer and photoresist patterning, which increases manufacturing costs and time. Consequently, productivity decreases.

BRIEF SUMMARY OF THE INVENTION

The invention is directed to a method of fabricating a flash memory device, which can prevent lowering of the reliability of the device during a process for forming drain contacts, while simplifying the process.

According to a method of fabricating a flash memory device in accordance with an embodiment of the invention, a pre-metal dielectric layer, a hard mask layer, and a first etch mask pattern are sequentially formed over a semiconductor substrate. An auxiliary layer is formed along a surface of the first etch mask pattern and the hard mask layer. An etch mask layer is formed on the auxiliary layer to gap-fill a space between adjacent first etch mask pattern elements. The etch mask layer is etched to form a second etch mask pattern between adjacent first etch mask pattern elements. The auxiliary layer between the first etch mask pattern and the second etch mask pattern is removed. A hard mask pattern is formed by etching the hard mask layer between the first etch mask pattern and the second etch mask pattern. Contact holes are formed in the pre-metal dielectric layer using an etch process employing the hard mask pattern as a mask.

The first etch mask pattern is, preferably, formed to cross neighboring drain select lines.

first etch mask pattern is, preferably, formed at a pitch twice larger as a pitch of the contact holes in areas between the contact holes.

The formation of the second etch mask pattern preferably further include coating a photoresist film on the etch mask layer, and performing exposure and development process on the photoresist film to etch the etch mask layer while forming a photoresist film pattern to expose areas in which the contact holes will be formed.

The etch mask layer are preferably then etched between neighboring drain select lines to form the second etch mask pattern.

A thickness of the auxiliary layer formed on a sidewall of the first etch mask pattern is, preferably, proportional to a width of the contact hole.

The first etch mask pattern is, preferably, formed using a bottom anti-reflective coating (BARC) layer containing silicon (Si).

Preferably, the hard mask layer has a stack structure of an amorphous carbon layer and a silicon oxynitride layer.

The second etch mask pattern is, preferably, formed of a photoresist film pattern containing silicon (Si).

The auxiliary layer is, preferably, formed of a carbon polymer layer.

The auxiliary layer is, preferably, removed using a gas that includes $O_2$.

BRIEF DESCRIPTION OF THE DRAWINGS

For a more complete understanding of the disclosure, reference should be made to the following detailed description and accompanying drawings.

Figure 1A:
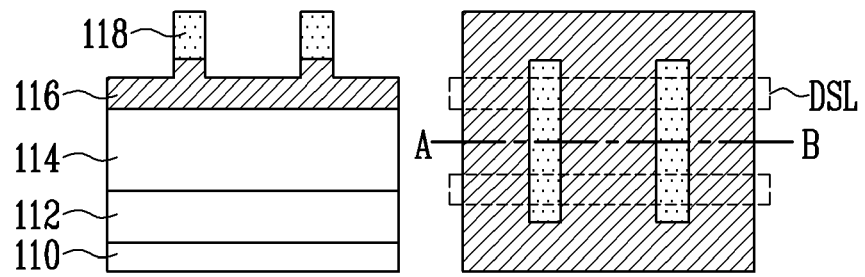
FIGS. 1A to 1H are sectional views sequentially illustrating a method of fabricating a flash memory device in accordance with the invention.

While the disclosed method is susceptible of embodiments in various forms, specific embodiments are illustrated in the drawings (and will hereafter be described), with the understanding that the disclosure is intended to be illustrative, and is not intended to limit the invention to the specific embodiments described and illustrated herein.

DESCRIPTION OF SPECIFIC EMBODIMENTS

An embodiment according to the invention is described in detail below with reference to the accompanying drawings. However, the invention is not limited to the disclosed embodiment, but may be implemented in various manners. The embodiment is provided to complete the disclosure of the invention and to allow those having ordinary skill in the art to understand the scope of the invention. The invention is defined by the claims.

Referring to FIG. 1A, although not shown in the drawing, predetermined structures, including isolation layers, source select lines SSL, word lines WL, and drain select lines DSL, are formed over a semiconductor substrate 110. A pre-metal dielectric layer 112 for forming a drain contact, a hard mask layer including a first hard mask layer 114 and a second hard mask layer 116, and a first etch mask pattern 118 are sequentially formed on the entire structure of the semiconductor substrate 110 including the predetermined structure.

More specifically, a first etch mask layer and a first photoresist film (not shown) for forming the first etch mask pattern 118 are sequentially formed over the semiconductor substrate 110 including the second hard mask layer 116. The first photoresist film is patterned to thereby form a first photoresist film pattern (not shown). The first etch mask layer is etched using the first photoresist film pattern to form the first etch mask pattern 118. Preferably, the pitch of the first etch mask pattern 118 is twice as large as the pitch of a contact array to be subsequently formed. The first etch mask pattern 118 crosses neighboring drain select lines DSL on the substrate 110.

Preferably, the first etch mask pattern 118 is formed using a BARC layer containing silicon (Si). If the BARC layer containing silicon (Si) is used to form the first etch mask layer the number of processing steps can be reduced to thereby shorten the turnaround time and decrease expenses. Further, use of the silicon-containing BARC layer can prevent the crack problem, which occurs due to the stress of the underlying amorphous carbon layer when the polysilicon layer is used as the hard mask. Accordingly, efficiency and reliability can be improved.

The first etch mask layer can have, for example, a single layer comprised of the silicon-containing BARC layer, or plural layers. Plural layers additionally formed on the silicon-containing BARC layer can include, for example, a typical BARC layer not containing silicon (Si). Preferably, the first etch mask layer has a single silicon-containing BARC layer.

The pre-metal dielectric layer 112 can be formed, for example, of a high-density plasma (HDP) oxide layer. The hard mask layer can have, for example, a stack structure of the first hard mask layer 114 formed, for example, of amorphous carbon and the second hard mask layer 116 formed, for example, of a silicon oxynitride layer.

Figure 1B:
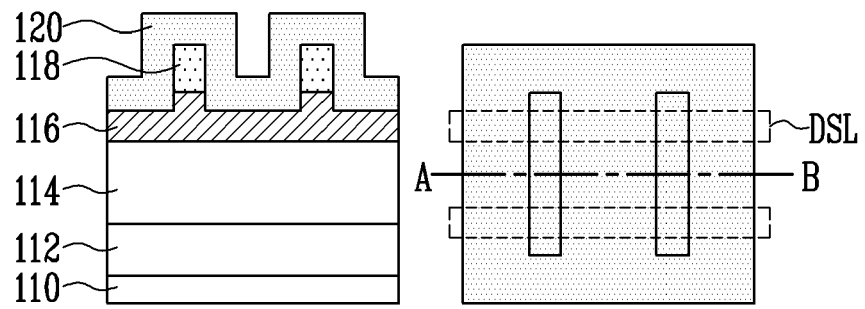

Referring to FIG. 1B, an auxiliary layer 120 is conformally formed along the first etch mask pattern 118 over the semiconductor substrate 110. Preferably, the auxiliary layer 120 is formed of a carbon polymer layer. A lateral thickness of the carbon polymer layer is substantially identical to a thickness of the subsequently formed contact array. The contact array can be formed in the same manner as the first etch mask pattern 118. If this carbon polymer layer is used as the auxiliary layer 120, a pattern pitch can be doubled (i.e. become more micro) to allow for the higher integration of flash memory devices of 32 nm or less.

Figure 1C:
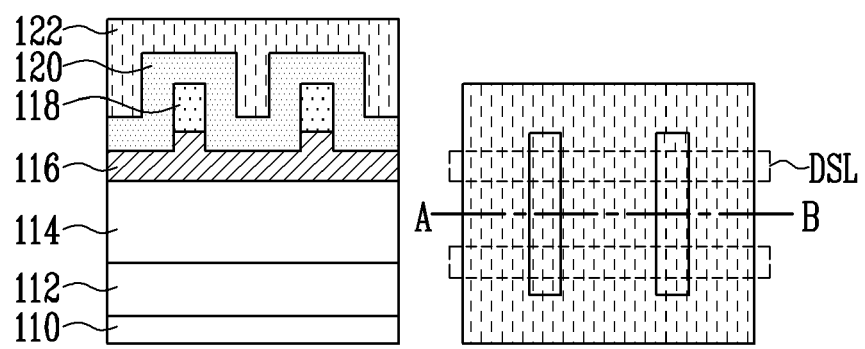

Referring to FIG. 1C, a second etch mask layer 122 is formed on the auxiliary layer 120 to gap-fill a space between adjacent first etch mask pattern 118 elements. Preferably, the second etch mask layer 122 is formed of a photoresist film containing silicon (Si).

Figure 1D:
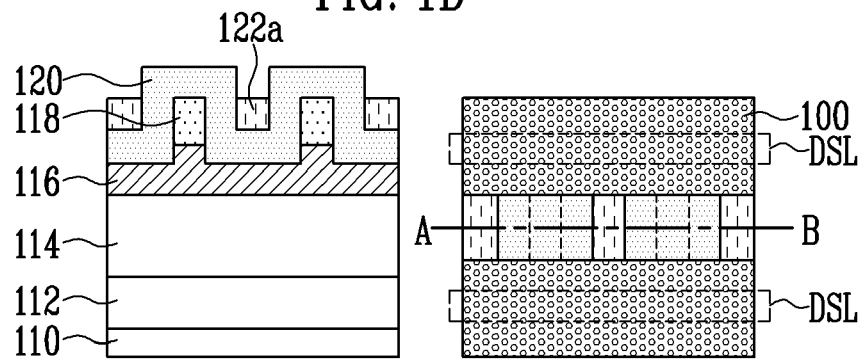

Referring to FIG. 1D, the second etch mask layer 122 formed between neighboring drain select lines is exposed and developed during in exposure and development processes used to form a photoresist film pattern 100. Formation of the photoresist film pattern exposes areas to define contact areas for subsequent formation of the contact array.

Referring to FIG. 1D, the second etch mask layer 122 is etched in areas between neighboring drain select lines to form a second etch mask pattern 122a between adjacent first etch mask pattern 118 elements. Preferably, the second etch mask pattern 122a has a height that is lower than a top height of the auxiliary layer 120.

More specifically, in order to form the photoresist film pattern 100 to expose areas in which contact holes are subsequently formed (i.e., the areas between neighboring the drain select lines DSL), a photoresist film is coated on the second etch mask layer 122. Exposure and development processes are then performed. In the exposure and development processes, the etch mask layer 122 formed in the areas between neighboring drain select lines DSL is etched at once. Accordingly, the etch mask layer 122 remains only on the auxiliary layer 120 between adjacent first etch mask pattern 118 elements to a specific thickness, thereby exposing a part of the auxiliary layer 120. In the areas between neighboring drain select lines DSL, the second etch mask pattern 122a remains between adjacent first etch mask pattern 118 elements, spaced apart from each other at a pitch twice large as the contact array pitch. Further, as shown in FIG. 1D, the second etch mask pattern 122a can have, for example, the same height as a height of the first etch mask pattern 118.

That is, after depositing carbon polymer to which the technology for doubling an ultra-micro pattern pitch will be applied, the etch mask layer 122 formed between neighboring drain select lines is exposed and developed during the exposure and development processes for forming the photoresist film pattern 100. Accordingly, a plurality of conventional etch mask layers using a multi-layer process becomes unnecessary. Thus, the process can be simplified, the manufacturing cost can be saved, and the turnaround time can be shortened. Consequently, the productivity can be improved.

Figure 1E:
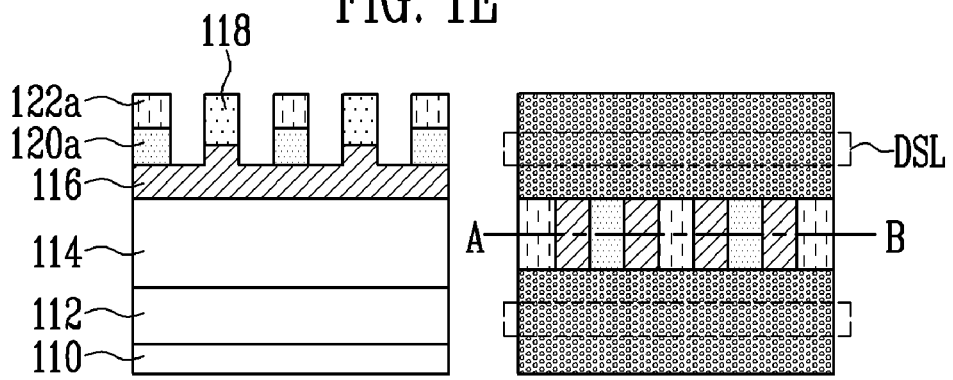

Referring to FIG. 1E, an anisotropic etch process is performed on the auxiliary layer 120 to remove a portion of the auxiliary layer between the first an second etch mask patterns 118, 122, thereby forming an auxiliary pattern that exposes the second hard mask pattern 116a in an area where the contact holes are subsequently formed. Preferably, an etch process using a gas that includes $O_2$ having selectivity can be performed on the first etch mask pattern 118 formed of the silicon-containing BARC layer and the second etch mask pattern 122a formed of the silicon-containing photoresist film.

Figure 1F:
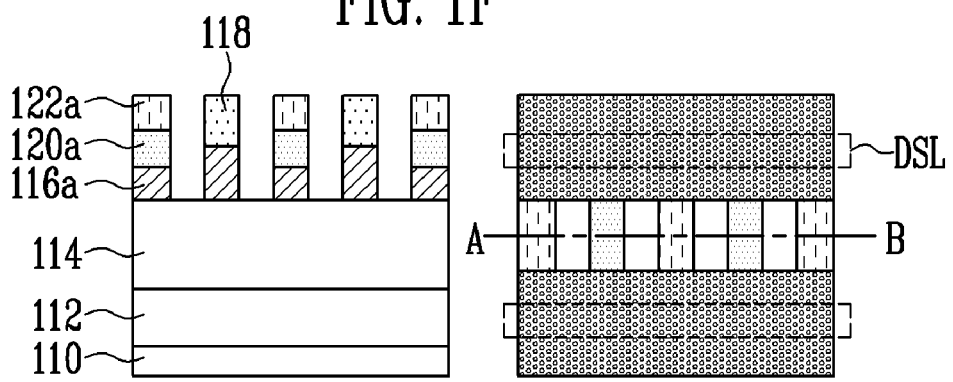

Referring to FIG. 1F, exposed portions of the second hard mask layer 116 are etched using the second etch mask pattern 122a and the first etch mask pattern 118 as a mask.

Figure 1G:
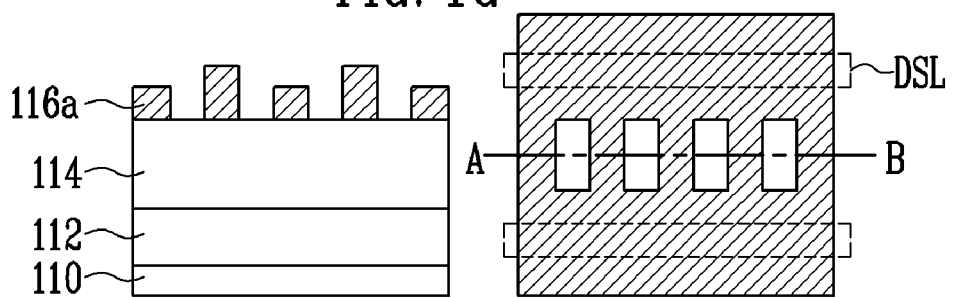

Referring to FIG. 1G, the second etch mask pattern 122a and the first etch mask pattern 118 are then removed. Accordingly, the second hard mask pattern 116a is formed on the first hard mask layer 114.

Figure 1H:
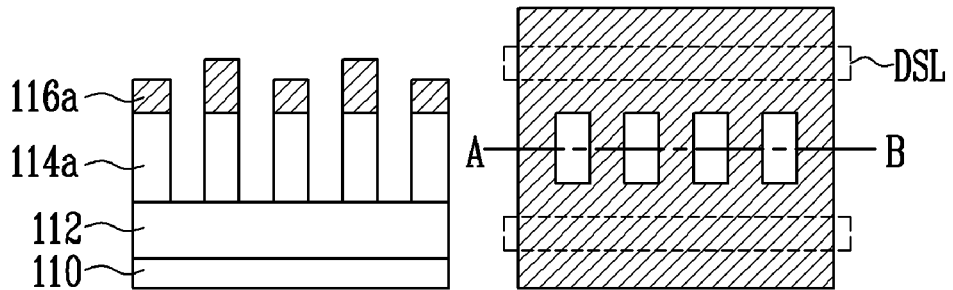

Referring to FIG. 1H, an etch process is performed on the first hard mask layer 114 using the second hard mask pattern 116a as a mask to expose the pre-metal dielectric layer 112. The stack type contact array pattern that includes the first hard mask pattern 114a and the second hard mask layer pattern 116a can be formed. Drain contact holes for forming drain contacts are formed by etching the pre-metal dielectric layer 112 using the stack type contact array pattern as a mask.

The embodiment disclosed herein has been proposed to allow a person skilled in the art to easily implement the invention, and the person skilled in the art may implement the invention in various ways. Therefore, the scope of the invention is not limited by or to the embodiment as described above, and should be construed to be defined only by the appended claims and their equivalents.

What is claimed is:

1. A method of fabricating a flash memory device, the method comprising:

sequentially forming a pre-metal dielectric layer, a hard mask layer, and a first etch mask pattern over a semiconductor substrate;

forming an auxiliary layer along a surface of the first etch mask pattern and the hard mask layer;

forming an etch mask layer on the auxiliary layer to gap-fill a space between adjacent first etch mask pattern elements;

etching the etch mask layer to form a second etch mask pattern on the auxiliary layer between adjacent first etch mask pattern elements;

etching the auxiliary layer to remove a portion of the auxiliary layer between the first etch mask pattern and the second etch mask pattern;

etching the hard mask layer between the first etch mask pattern and the second etch mask pattern to form a hard mask pattern; and etching the pre-metal dielectric layer using the hard mask pattern as a mask to form contact holes.

2. The method of claim 1, further comprising forming the first etch mask pattern to cross neighboring drain select lines.

3. The method of claim 1, further comprising forming the first etch mask pattern at a pitch twice larger than a pitch of the contact holes in areas between the contact holes.

4. The method of claim 1, further comprising forming the second etch mask pattern by
coating a photoresist film on the etch mask layer; and
performing an exposure and development process on the photoresist film to etch the etch mask layer while forming a photoresist film pattern to expose areas in which the contact holes are subsequently formed.

5. The method of claim 4, further comprising etching the etch mask layer formed between neighboring drain select lines.

6. The method of claim 1, wherein a thickness of the auxiliary layer formed on a sidewall of the first etch mask pattern is proportional to a width of the contact holes.

7. The method of claim 1, further comprising forming the first etch mask pattern using a bottom anti-reflective coating (BARC) layer containing silicon (Si).

8. The method of claim 1, further comprising forming the hard mask layer as a stack structure of an amorphous carbon layer and a silicon oxynitride layer.

9. The method of claim 1, further comprising forming the second etch mask pattern as a photoresist film pattern comprising silicon (Si).

10. The method of claim 1, further comprising forming the auxiliary layer of a carbon polymer layer.

11. The method of claim 10, further comprising removing the auxiliary layer using a gas comprising $O_2$.

* * * * *